United States Patent
Su et al.

(10) Patent No.: US 12,422,293 B2
(45) Date of Patent: Sep. 23, 2025

(54) SERVER AND AIR DUCT SENSING METHOD

(71) Applicant: Wiwynn Corporation, New Taipei (TW)

(72) Inventors: Po-Sheng Su, New Taipei (TW); Ching-Wen Hsiao, New Taipei (TW); Hsien-Yu Wang, New Taipei (TW); Tzu-Shun Wang, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 456 days.

(21) Appl. No.: 17/958,453

(22) Filed: Oct. 3, 2022

(65) Prior Publication Data
US 2024/0077349 A1 Mar. 7, 2024

(30) Foreign Application Priority Data
Sep. 7, 2022 (TW) .................. 111133928

(51) Int. Cl.
*G01F 15/06* (2022.01)
*H05K 7/20* (2006.01)

(52) U.S. Cl.
CPC ....... *G01F 15/068* (2013.01); *H05K 7/20145* (2013.01)

(58) Field of Classification Search
CPC ... G01F 15/068; G01F 25/15; H05K 7/20145; H05K 7/20727
See application file for complete search history.

(56) References Cited

U.S. PATENT DOCUMENTS

| | | | |
|---|---|---|---|
| 6,189,384 B1* | 2/2001 | Piety ................ | G01H 1/003 73/659 |
| 2009/0207565 A1* | 8/2009 | Glover .............. | H05K 7/20727 361/688 |
| 2015/0248827 A1* | 9/2015 | Yu .................... | G06F 1/20 340/540 |

FOREIGN PATENT DOCUMENTS

TW 201540166 A 10/2015

* cited by examiner

*Primary Examiner* — Omer S Khan
(74) *Attorney, Agent, or Firm* — Winston Hsu (57) ABSTRACT

A server includes a chassis, an air duct, a sensing module and a board management controller. The air duct is disposed in the chassis. The sensing module is disposed in the chassis. The sensing module senses whether the air duct is correctly installed. The board management controller is disposed in the chassis and coupled to the sensing module. When the air duct is not correctly installed, the sensing module notifies the board management controller to generate a warning message.

4 Claims, 11 Drawing Sheets

FIG. 14

SERVER AND AIR DUCT SENSING METHOD

BACKGROUND OF THE INVENTION

1. Field of the Invention

The invention relates to a server and an air duct sensing method and, more particularly, to a server and an air duct sensing method capable of sensing whether an air duct is correctly installed in a chassis.

2. Description of the Prior Art

A server is used to serve various computers or portable electronic devices in network system. As the performance of the server is continuously improved, the system power consumption of the server is also getting higher and higher. In general, there is an air duct installed in the server, so as to utilize the air duct to guide an airflow generated by a fan to an electronic component (e.g. hard disk, interface card, etc.) for heat dissipation. When the server is maintained or tested, the air duct sometimes may be removed temporarily. After maintenance or testing, if the air duct is not correctly installed, the temperature of the electronic component will rise to affect the performance. Therefore, how to ensure that the air duct is correctly installed in a chassis of the server has become a significant design issue.

SUMMARY OF THE INVENTION

The invention provides a server and an air duct sensing method capable of sensing whether an air duct is correctly installed in a chassis, so as to solve the aforesaid problems.

According to an embodiment of the invention, a server comprises a chassis, an air duct, a sensing module and a board management controller. The air duct is disposed in the chassis. The sensing module is disposed in the chassis. The sensing module senses whether the air duct is correctly installed. The board management controller is disposed in the chassis and coupled to the sensing module. When the air duct is not correctly installed, the sensing module notifies the board management controller to generate a warning message.

According to another embodiment of the invention, an air duct sensing method comprises steps of disposing an air duct in a chassis; a sensing module sensing whether the air duct is correctly installed; and when the air duct is not correctly installed, the sensing module notifying a board management controller to generate a warning message.

As mentioned in the above, the invention disposes the sensing module in the chassis, so as to utilize the sensing module to sense whether the air duct is correctly installed. When the air duct is not correctly installed, the sensing module notifies the board management controller to generate a warning message to notify a user to reinstall the air duct. Accordingly, the invention can ensure that the air duct is correctly installed in the chassis of the server, so as to prevent the temperature of an electronic component from rising to affect the performance. Furthermore, the air duct sensing method of the invention may be applied not only to server, but also to storage, switch or other electronic devices equipped with the air duct.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
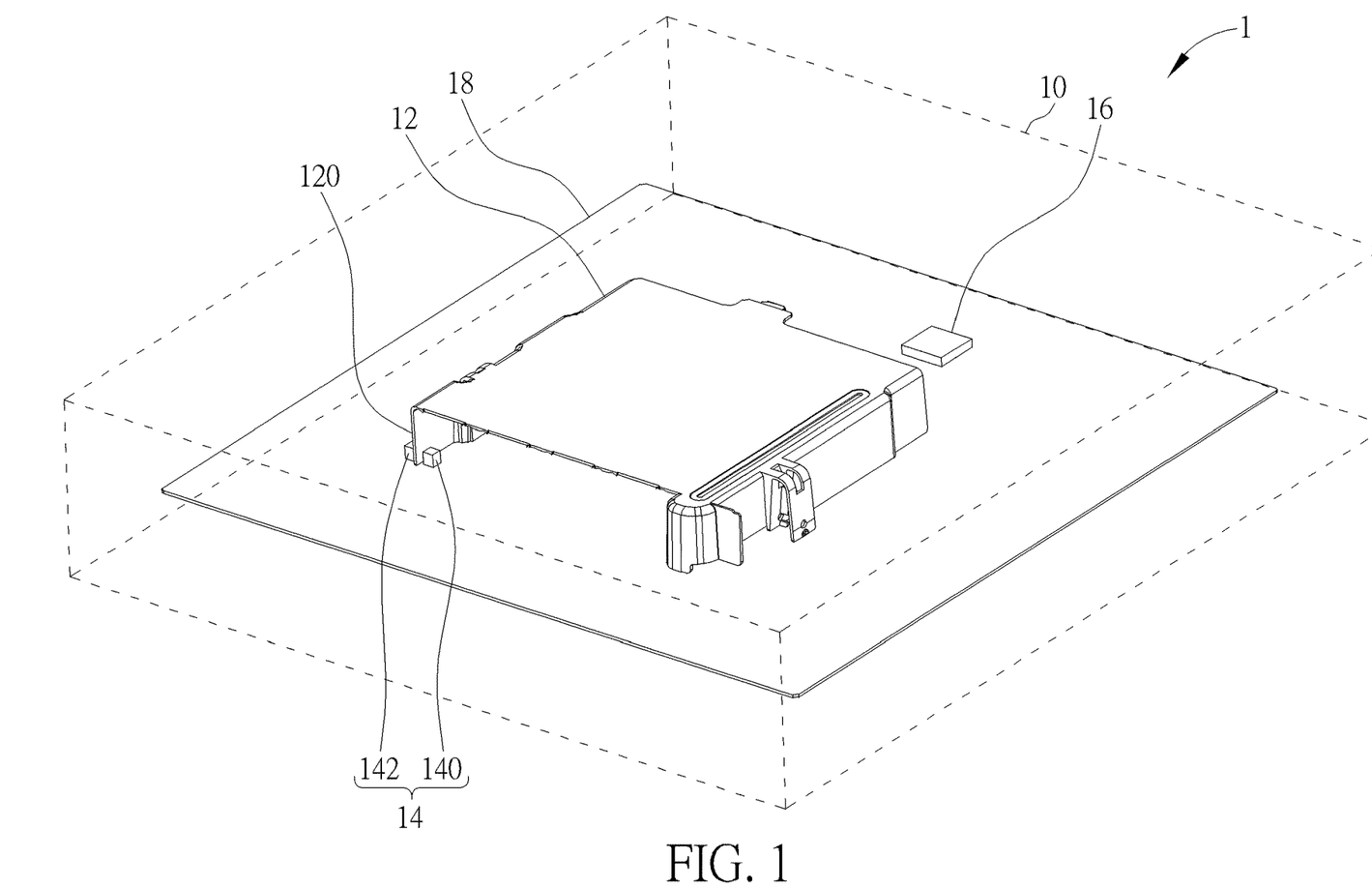
FIG. 1 is a perspective view illustrating a server according to an embodiment of the invention.
Figure 2:
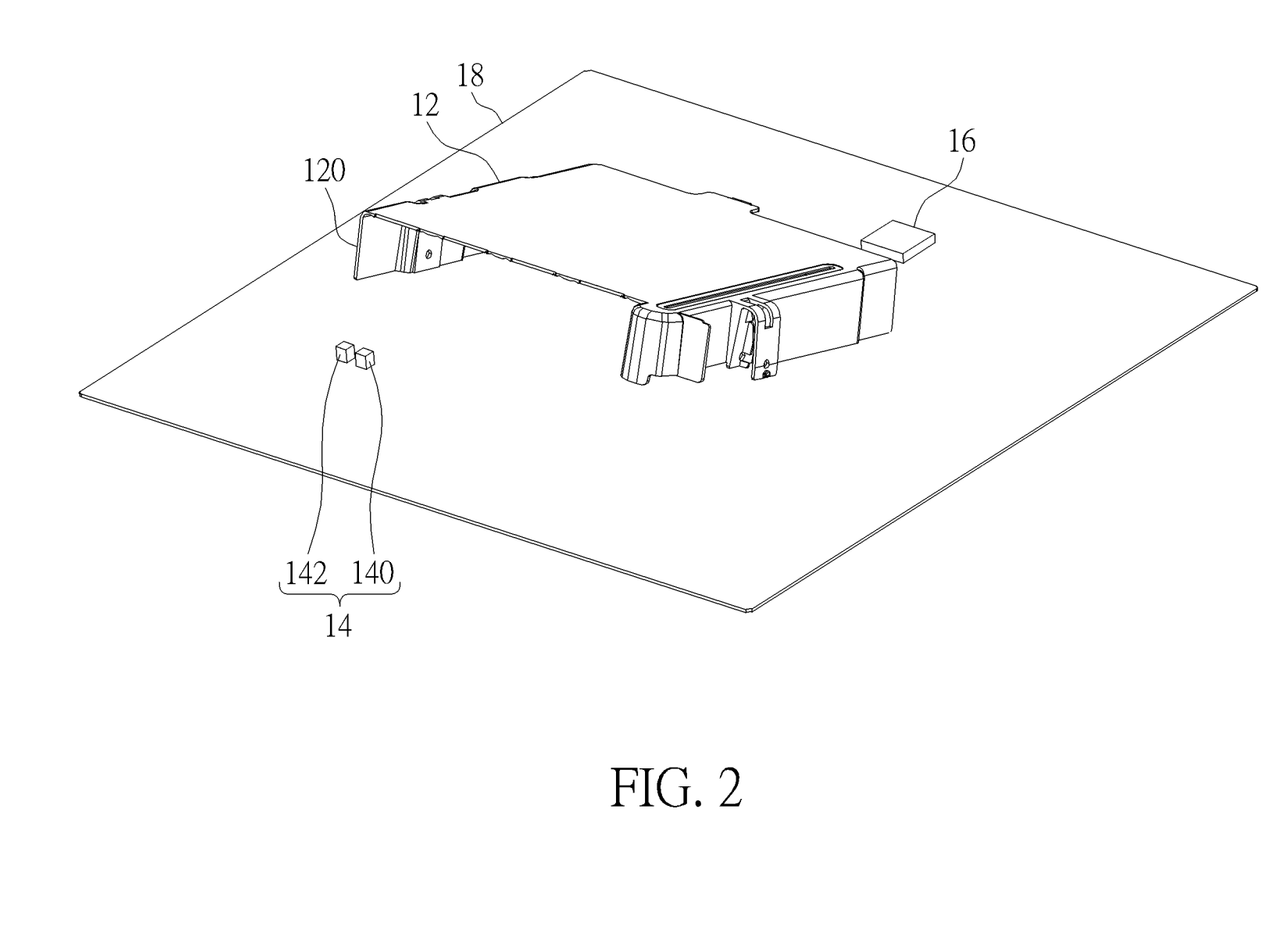
FIG. 2 is a perspective view illustrating an air duct shown in FIG. 1 not correctly installed.

Referring to FIGS. 1 and 2, FIG. 1 is a perspective view illustrating a server 1 according to an embodiment of the invention, and FIG. 2 is a perspective view illustrating an air duct 12 shown in FIG. 1 not correctly installed.

As shown in FIGS. 1 and 2, the server 1 comprises a chassis 10, an air duct 12, a sensing module 14, a board management controller (BMC) 16 and a circuit board 18, wherein the air duct 12, the sensing module 14, the board management controller 16 and the circuit board 18 are disposed in the chassis 10. In this embodiment, the board management controller 16 may be disposed on the circuit board 18 and coupled to the sensing module 14 through an input/output unit (e.g. general purpose input and output (GPIO)). In general, the server 1 may be further equipped with some necessary hardware and software components for specific purposes, such as memory, power supply, hard disk, fan, applications, communication module, etc., and it depends on practical applications. Furthermore, the chassis 10 shown in FIG. 1 is illustrated by dotted line and the appearance and size of the chassis 10 may be designed according to practical applications.

The air duct 12 is configured to guide an airflow generated by a fan (not shown) to an electronic component (e.g. hard disk, interface card, etc., not shown) for heat dissipation. The sensing module 14 is configured to sense whether the air duct 12 is correctly installed. When the air duct 12 is not correctly installed, the sensing module 14 will notify the board management controller 16 through the input/output unit to generate a warning message, so as to notify a user to reinstall the air duct 12. Accordingly, the invention can ensure that the air duct 12 is correctly installed in the chassis 10 of the server 1, so as to prevent the temperature of the electronic component from rising to affect the performance.

In this embodiment, the sensing module 14 may comprise a light emitting component 140 and a light sensor 142. The light emitting component 140 and the light sensor 142 may also be disposed on the circuit board 18 and correspond to an installation position of the air duct 12. The light emitting component 140 may be, but is not limited to, a light emitting diode (LED). When the sensing module 14 is operating, the light emitting component 140 emits a light toward the light sensor 142. In this embodiment, the light emitted by the light emitting component may have a specific wavelength. For example, the light emitted by the light emitting component 140 may be infrared, ultraviolet or other light with specific wavelengths according to practical applications. In another embodiment, the light emitted by the light emitting component 140 may be encoded in advance. For example, the light emitted by the light emitting component 140 may be encoded as 1000101 or other specific codes in advance according to practical applications. In another embodiment, the light emitted by the light emitting component 140 may have a specific wavelength and be encoded in advance at the same time according to practical applications.

As shown in FIG. 1, when the air duct 12 is correctly installed, an edge 120 of the air duct 12 is located between the light emitting component 140 and the light sensor 142 to block the light emitted by the light emitting component 140. At this time, the light sensor 142 cannot receive the light emitted by the light emitting component 140. In other words, when the light sensor 142 does not receive the light emitted by the light emitting component 140, it means that the air duct 12 is correctly installed. It should be noted that the edge 120 may be a side wall of the air duct 12 or other light shielding structures on the side wall according to practical applications. For example, when the air duct 12 is made of a transparent material, an opaque material may be disposed on the edge 120 of the air duct 12 to block the light emitted by the light emitting component 140. The opaque material may be conductive gasket, mylar, label, black ink or other light absorption material according to practical applications. Needless to say, the air duct 12 may also be made of an opaque material, such that the edge 120 itself is opaque.

As shown in FIG. 2, when the air duct 12 is not correctly installed, there is no shielding object between the light emitting component 140 and the light sensor 142. At this time, the light sensor 142 receives the light emitted by the light emitting component 140 to notify the board management controller 16 to generate the warning message, so as to notify a user to reinstall the air duct 12. Accordingly, the invention can ensure that the air duct 12 is correctly installed in the chassis 10 of the server 1, so as to prevent the temperature of the electronic component from rising to affect the performance. Since the light emitted by the light emitting component 140 has a specific wavelength and/or a specific code, the invention can prevent misjudgment from occurring due to the influence of ambient light. It should be noted that the definition of the aforesaid "not correctly installed" includes the case where the air duct 12 is not installed.

Figure 3:
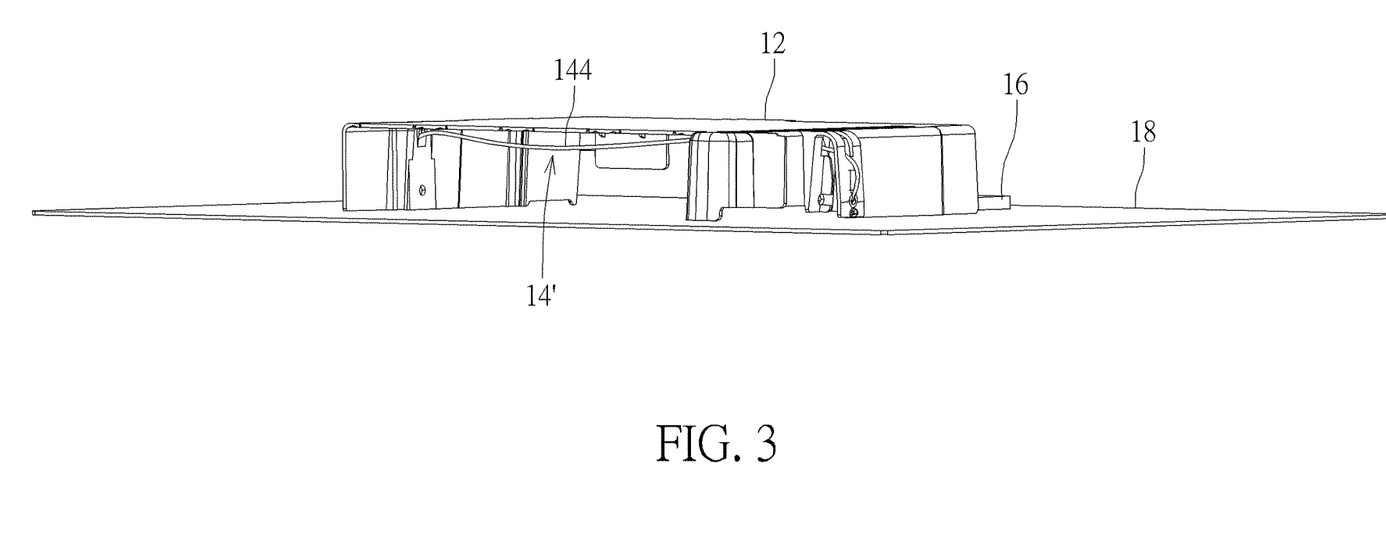
FIG. 3 is a perspective view illustrating a conductor of a sensing module disposed on an air duct according to another embodiment of the invention.
Figure 4:
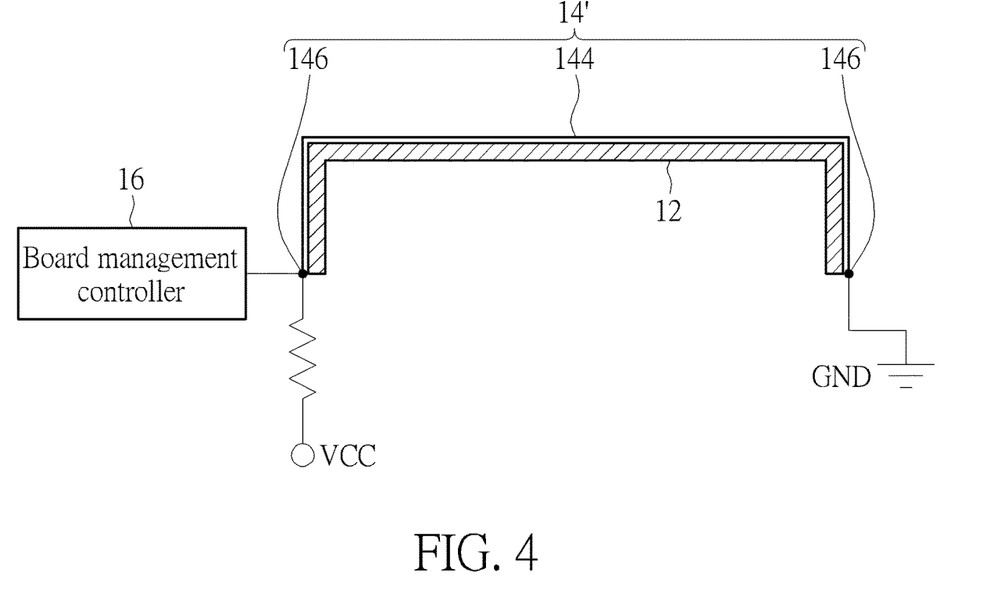
FIG. 4 is a schematic circuit diagram illustrating the air duct shown in FIG. 3 being correctly installed.
Figure 5:
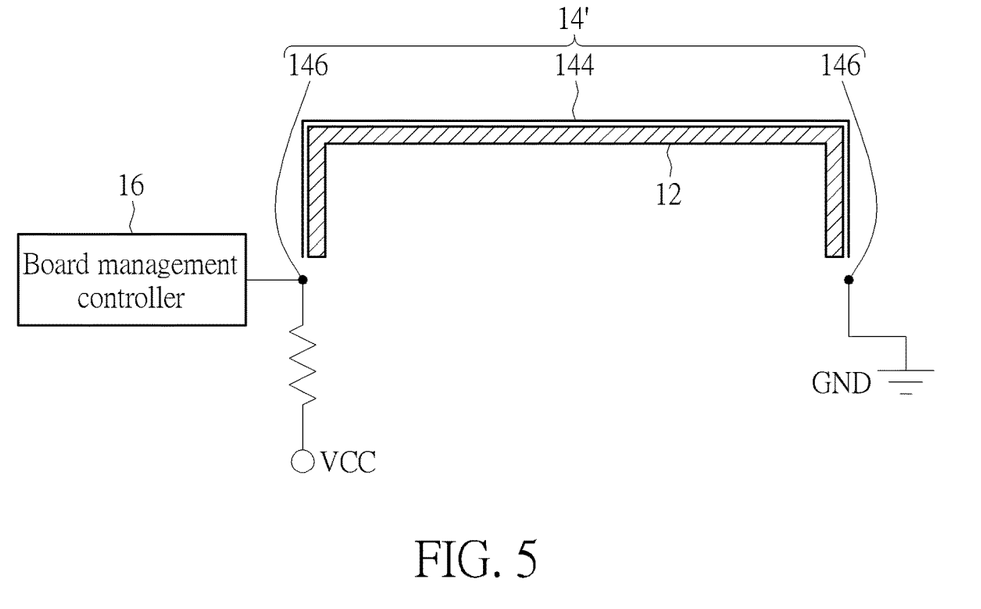
FIG. 5 is a schematic circuit diagram illustrating the air duct shown in FIG. 3 being not correctly installed.

Referring to FIGS. 3 to 5, FIG. 3 is a perspective view illustrating a conductor 144 of a sensing module 14' disposed on an air duct 12 according to another embodiment of the invention, FIG. 4 is a schematic circuit diagram illustrating the air duct 12 shown in FIG. 3 being correctly installed, and FIG. 5 is a schematic circuit diagram illustrating the air duct 12 shown in FIG. 3 being not correctly installed.

As shown in FIGS. 3 to 5, the sensing module 14' comprises a conductor 144 and two electrical pads 146. The aforesaid sensing module 14 may be replaced by the sensing module 14'. The conductor 144 is disposed on the air duct 12. In this embodiment, the conductor 144 may be, but is not limited to, a wire. The two electrical pads 146 are disposed on the circuit board 18 and correspond to the installation position of the air duct 12. One of the two electrical pads 146 is grounded and the other one of the two electrical pads 146 is coupled to the board management controller 16 and a power supply VCC.

As shown in FIG. 4, when the air duct 12 is correctly installed, two ends of the conductor 144 respectively contact the two electrical pads 146, such that the board management controller 16 reads a low signal from the ground GND. In other words, when the board management controller 16 reads the low signal from the ground GND, it means that the air duct 12 is correctly installed.

As shown in FIG. 5, when the air duct 12 is not correctly installed, at least one of the two ends of the conductor 144 is separated from at least one of the two electrical pads 146, such that the board management controller 16 reads a high signal from the power supply VCC. In other words, when the board management controller 16 reads a high signal from the power supply VCC, it means that the air duct 12 is not correctly installed. At this time, the board management controller 16 generates the warning message to notify a user to reinstall the air duct 12. Accordingly, the invention can ensure that the air duct 12 is correctly installed in the chassis 10 of the server 1 shown in FIG. 1, so as to prevent the temperature of the electronic component from rising to affect the performance.

Figure 6:
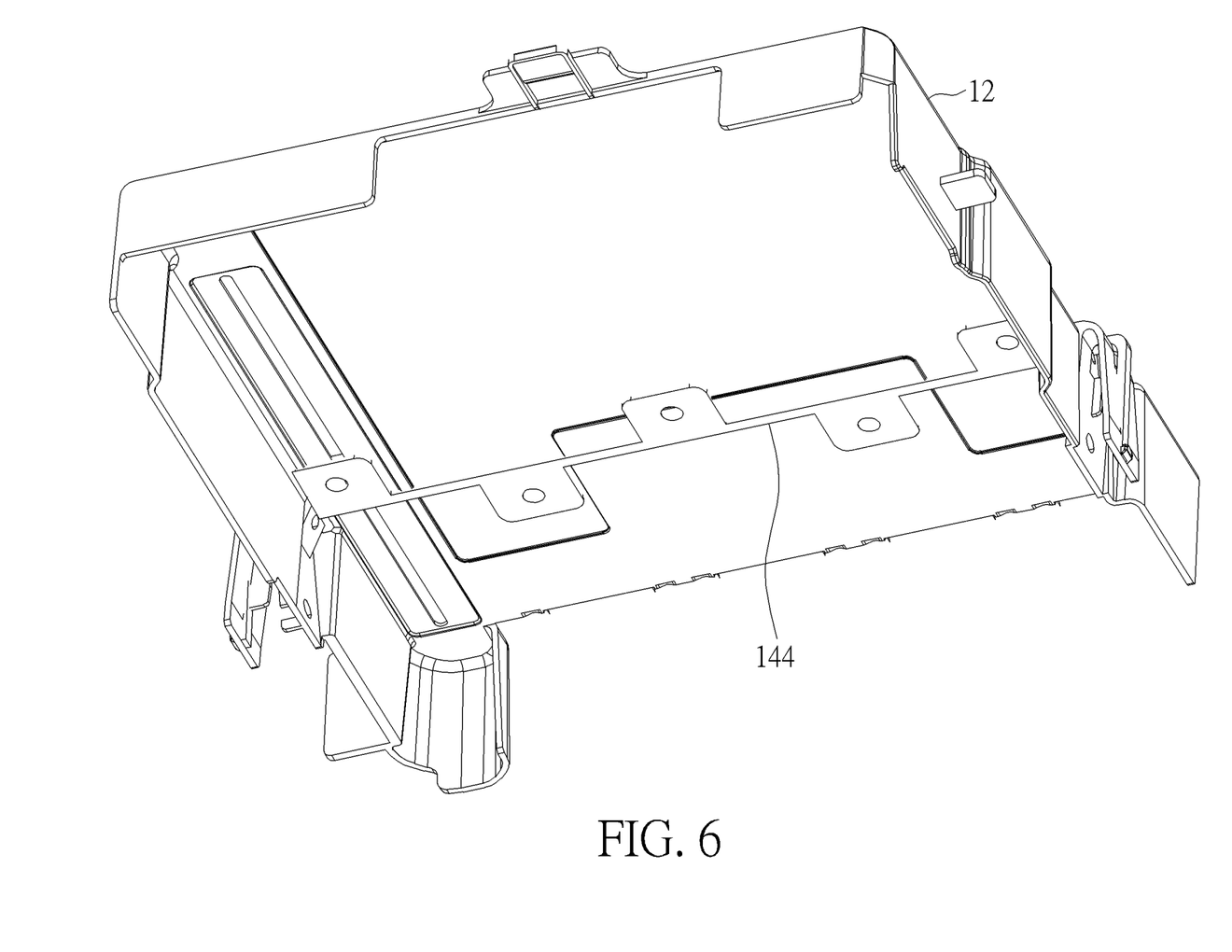
FIG. 6 is a perspective view illustrating the conductor disposed on the air duct according to another embodiment of the invention.
Figure 7:
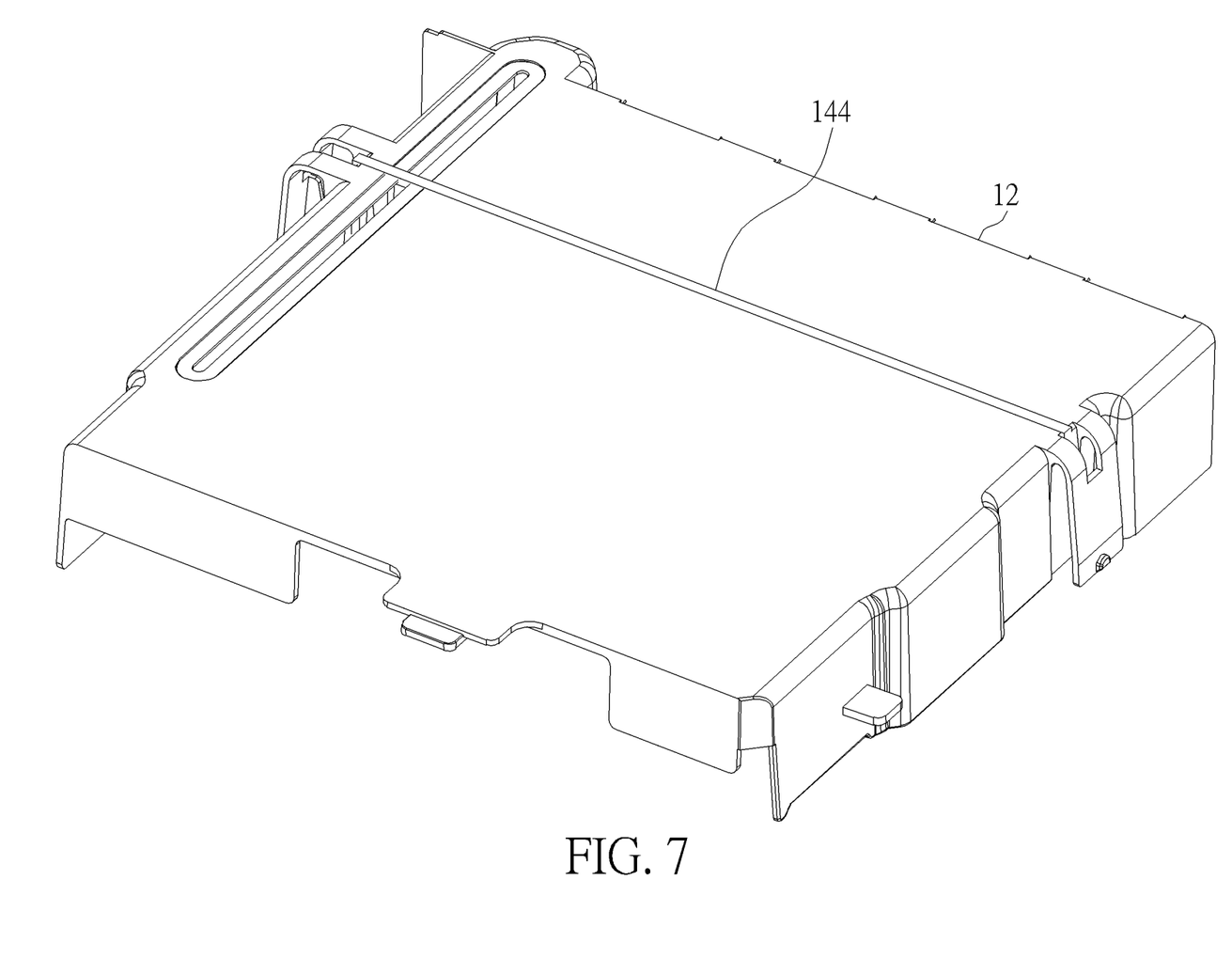
FIG. 7 is a perspective view illustrating the conductor disposed on the air duct according to another embodiment of the invention.

Referring to FIGS. 6 and 7, FIG. 6 is a perspective view illustrating the conductor 144 disposed on the air duct 12 according to another embodiment of the invention, and FIG. 7 is a perspective view illustrating the conductor 144 disposed on the air duct 12 according to another embodiment of the invention.

As shown in FIG. 6, the conductor 144 may be a metal sheet, wherein the metal sheet may be disposed on the air duct 12 by insert molding, but the invention is not so limited. As shown in FIG. 7, the conductor 14 may be a conducting paint, wherein the conducting paint may be coated on the air duct 12. The conductor 144 shown in FIG. 4 may be replaced by the conductor 144 shown in FIG. 6 or 7 and the principles thereof are substantially the same, so the repeated explanation will not be depicted herein again.

Figure 8:
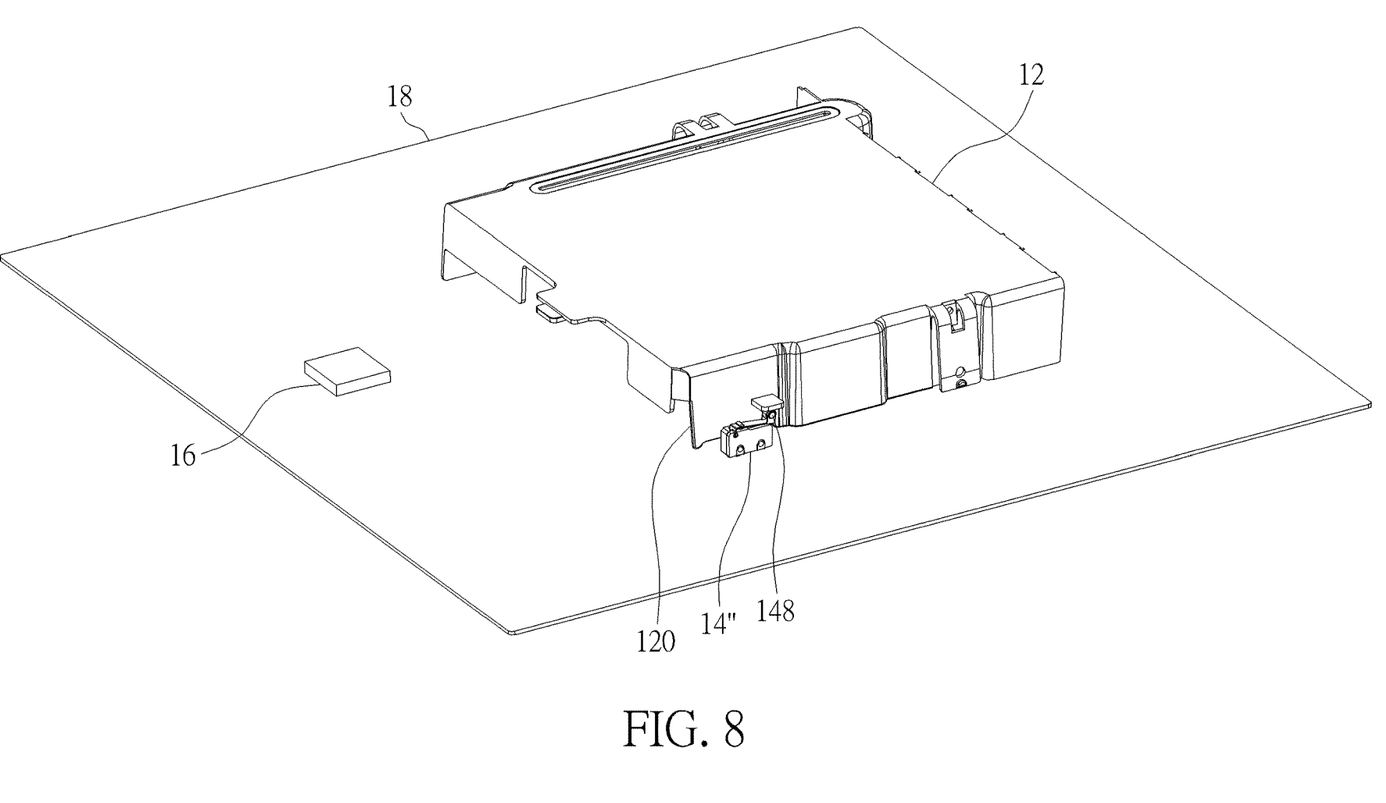
FIG. 8 is a perspective view illustrating a sensing module according to another embodiment of the invention.
Figure 9:
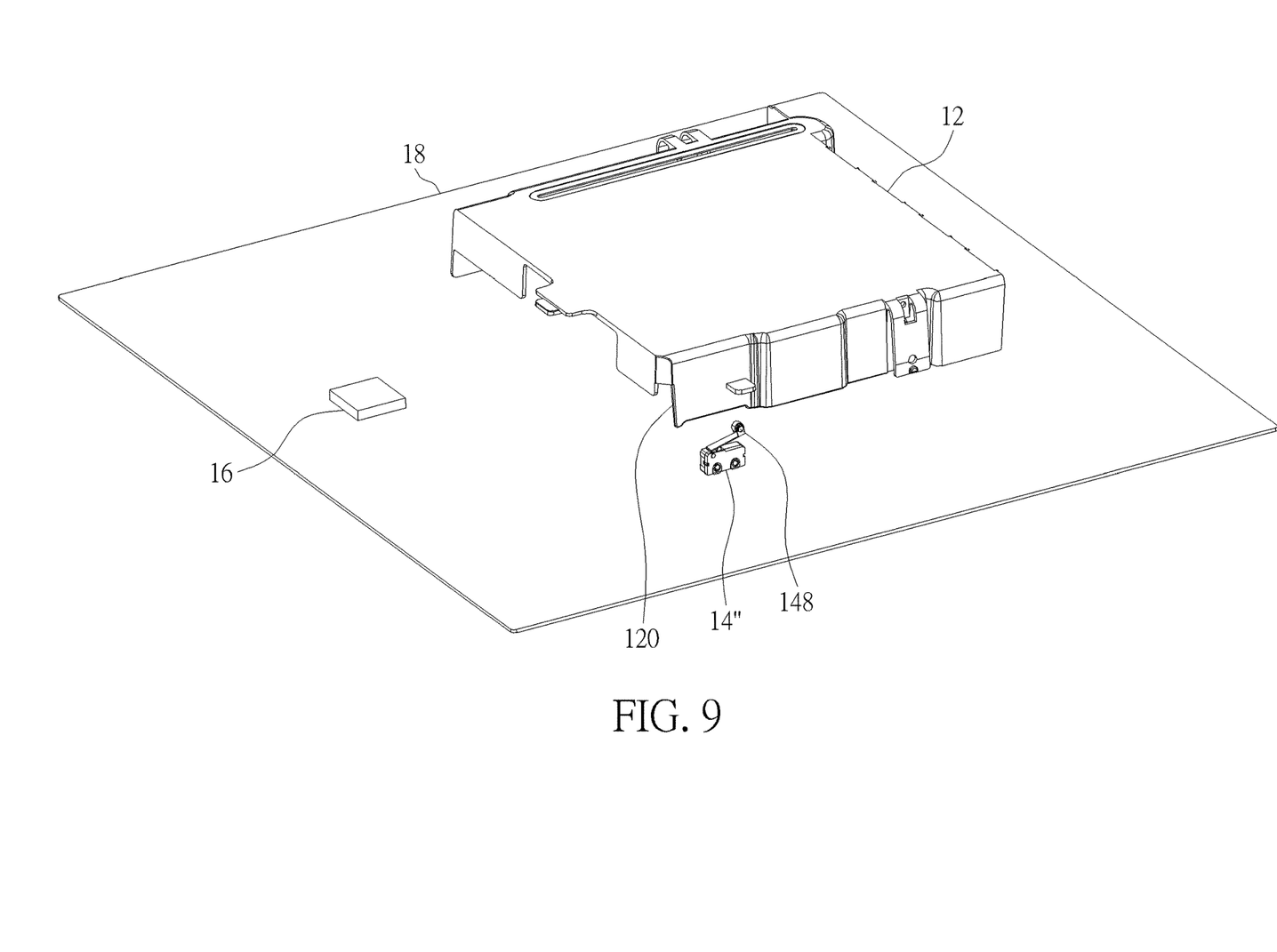
FIG. 9 is a perspective view illustrating an air duct shown in FIG. 8 being not correctly installed.

Referring to FIGS. 8 and 9, FIG. 8 is a perspective view illustrating a sensing module 14" according to another embodiment of the invention, and FIG. 9 is a perspective view illustrating an air duct 12 shown in FIG. 8 being not correctly installed.

As shown in FIGS. 8 and 9, the sensing module 14" may be a contact switch (e.g. limit switch). The aforesaid sensing module 14 may also be replaced by the sensing module 14". The sensing module 14" may also be disposed on the circuit board 18 and corresponds to the installation position of the air duct 12. In this embodiment, the sensing module 14" may be disposed at a position close to the edge 120 of the air duct 12.

As shown in FIG. 8, when the air duct 12 is correctly installed, the edge 120 of the air duct 12 presses a sensing end 148 of the contact switch (i.e. sensing module 14"). In other words, when the sensing end 148 of the contact switch is pressed, it means that the air duct 12 is correctly installed.

As shown in FIG. 9, when the air duct 12 is not correctly installed, the sensing end 148 of the contact switch is not pressed. In other words, when the sensing end 148 of the contact switch is not pressed, it means that the air duct 12 is not correctly installed. At this time, the board management controller 16 generates the warning message to notify a user to reinstall the air duct 12. Accordingly, the invention can ensure that the air duct 12 is correctly installed in the chassis 10 of the server 1 shown in FIG. 1, so as to prevent the temperature of the electronic component from rising to affect the performance.

Figure 10:
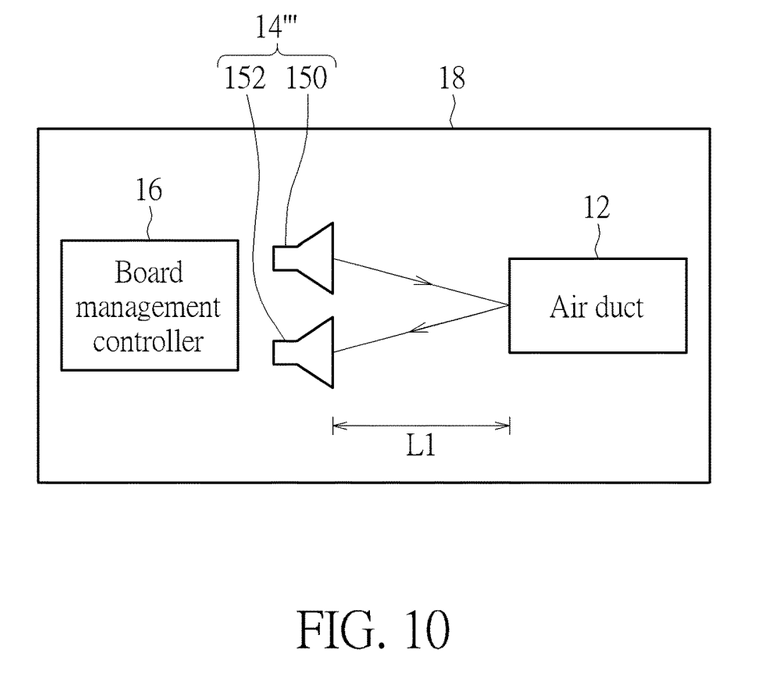
FIG. 10 is a schematic view illustrating a sensing module according to another embodiment of the invention.
Figure 11:
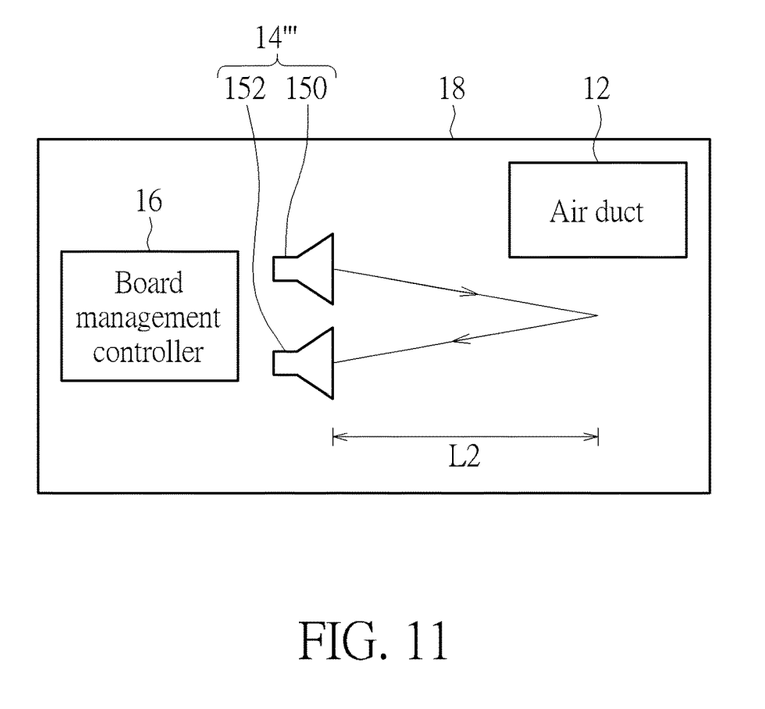
FIG. 11 is a schematic view illustrating an air duct shown in FIG. 10 being not correctly installed.

Referring to FIGS. 10 and 11, FIG. 10 is a schematic view illustrating a sensing module 14''' according to another embodiment of the invention, and FIG. 11 is a schematic view illustrating an air duct 12 shown in FIG. 10 being not correctly installed.

As shown in FIGS. 10 and 11, the sensing module 14''' may comprise an ultrasonic transmitter 150 and an ultrasonic receiver 152. The aforesaid sensing module 14 may also be replaced by the sensing module 14'''. When the sensing module 14''' is operating, the ultrasonic transmitter 150 is configured to transmit an ultrasound and the ultrasonic receiver 152 is configured to receive a reflected ultrasound of the ultrasound to obtain a measured distance. As shown in FIG. 10, when the air duct 12 is correctly installed, the measured distance is obtained as L1. As shown in FIG. 11, when the air duct 12 is not correctly installed, the measured distance is obtained as L2.

In this embodiment, a reference distance Lr is set in the board management controller 16 in advance, wherein the reference distance Lr is identical to the measured distance L1 obtained when the air duct 12 is correctly installed, i.e. Lr=L1. Thus, when the air duct 12 is correctly installed, the board management controller 16 determines that the measured distance L1 is identical to the reference distance Lr. In other words, when the board management controller 16 determines that the measured distance L1 is identical to the reference distance Lr, it means that the air duct 12 is correctly installed. On the other hand, when the air duct 12 is not correctly installed, the board management controller 16 determines that the measured distance L2 is different from the reference distance Lr. In other words, when the board management controller 16 determines that the measured distance L2 is different from the reference distance Lr, it means that the air duct 12 is not correctly installed. At this time, the board management controller 16 generates the warning message to notify a user to reinstall the air duct 12. Accordingly, the invention can ensure that the air duct 12 is correctly installed in the chassis 10 of the server 1 shown in FIG. 1, so as to prevent the temperature of the electronic component from rising to affect the performance.

Figure 12:
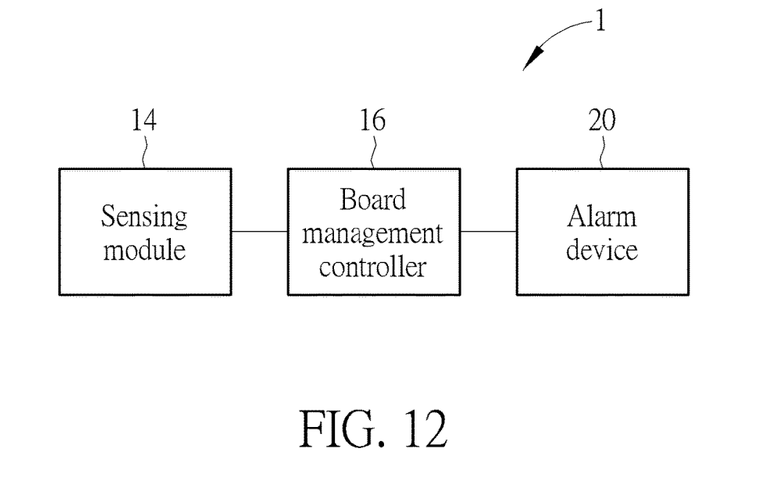
FIG. 12 is a functional block diagram illustrating the server shown in FIG. 1.

Referring to FIG. 12, FIG. 12 is a functional block diagram illustrating the server 1 shown in FIG. 1. As shown in FIG. 12, the server 1 may further comprise an alarm device 20, wherein the board management controller 16 is coupled to the sensing module 14 and the alarm device 20. As mentioned in the above, the sensing module 14 may also be replaced by the sensing module 14', 14" or 14'''. When the board management controller 16 determines that the air duct 12 is not correctly installed according to the aforesaid manners, the board management controller 16 may control the alarm device 20 to send out the warning message to notify a user to reinstall the air duct 12. In this embodiment, the alarm device 20 may be a display device, a speaker, a light emitting component or a combination thereof, and the warning message may be an image, text, sound, light or a combination thereof according to practical applications.

In another embodiment, the alarm device 20 may also be a buzzer or other components integrated into the board management controller 16 according to practical applications.

Figure 13:
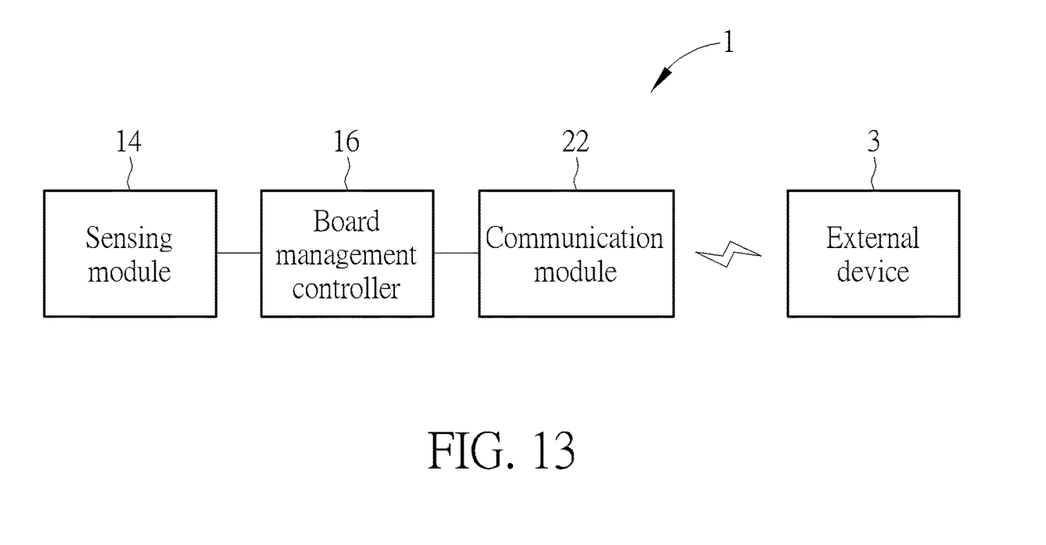
FIG. 13 is a functional block diagram illustrating the server according to another embodiment of the invention.

Referring to FIG. 13, FIG. 13 is a functional block diagram illustrating the server 1 according to another embodiment of the invention. As shown in FIG. 13, the server 1 may further comprise a communication module 22, wherein the board management controller 16 is coupled to the sensing module 14 and the communication module 22. As mentioned in the above, the sensing module 14 may also be replaced by the sensing module 14', 14" or 14'''. In this embodiment, when the board management controller 16 determines that the air duct is not correctly installed according to the aforesaid manners, the board management controller 16 may control the communication module 22 to send out the warning message to an external device 3, so as to notify a user to reinstall the air duct 12. In this embodiment, the communication module 22 may be a Wi-Fi communication module, a Bluetooth communication module or other wireless communication modules according to practical applications. Furthermore, the external device 3 may be a mobile phone, a tablet computer or other electronic devices according to practical applications.

Figure 14:
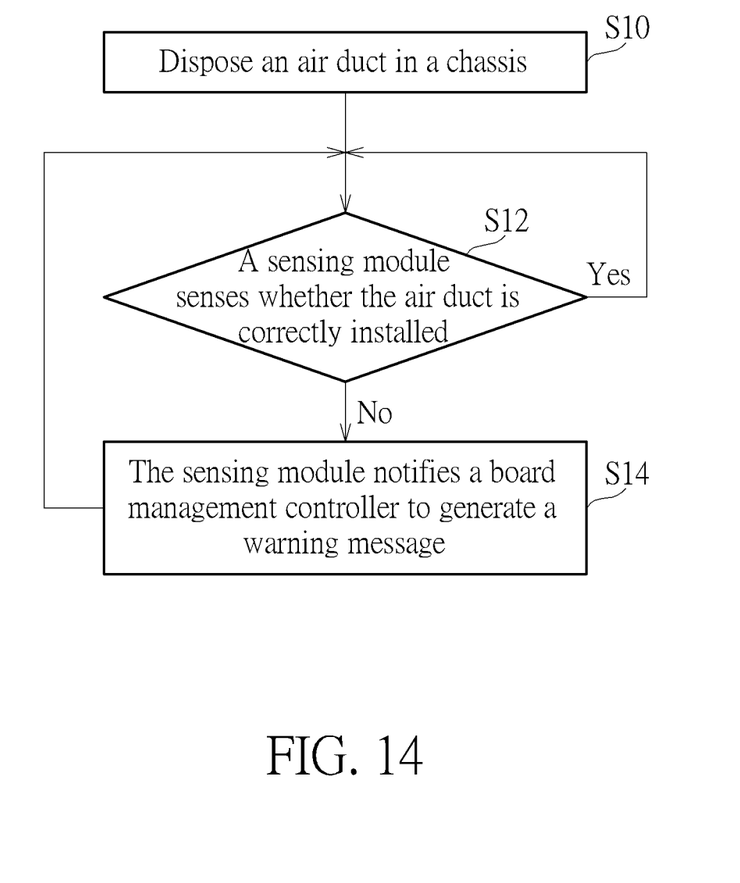
FIG. 14 is a flowchart illustrating an air duct sensing method according to an embodiment of the invention.

Referring to FIG. 14, FIG. 14 is a flowchart illustrating an air duct sensing method according to an embodiment of the invention. The air duct sensing method shown in FIG. 14 is adapted to the server 1 shown in FIG. 1. First, a user disposes an air duct 12 in a chassis 10 (step S10). Then, a sensing module 14 senses whether the air duct 12 is correctly installed (step S12). When the air duct 12 is not correctly installed, the sensing module 14 notifies a board management controller 16 to generate a warning message (step S14) and the sensing module 14 keeps sensing whether the air duct 12 is correctly installed (step S12). Furthermore, when the air duct 12 is correctly installed, the sensing module 14 also keeps sensing whether the air duct 12 is correctly installed (step S12). As mentioned in the above, the sensing module 14 may also be replaced by the sensing module 14', 14" or 14'''.

It should be noted that the detailed embodiments of the air duct sensing method of the invention are mentioned in the above and those will not be depicted herein again. Furthermore, each part or function of the control logic of the air duct sensing method of the invention may be implemented by a combination of software and hardware.

As mentioned in the above, the invention disposes the sensing module in the chassis, so as to utilize the sensing module to sense whether the air duct is correctly installed. When the air duct is not correctly installed, the sensing module notifies the board management controller to generate a warning message to notify a user to reinstall the air duct. Accordingly, the invention can ensure that the air duct is correctly installed in the chassis of the server, so as to prevent the temperature of an electronic component from rising to affect the performance. Furthermore, the air duct sensing method of the invention may be applied not only to server, but also to storage, switch or other electronic devices equipped with the air duct.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server comprising:
a chassis;
an air duct disposed in the chassis;
a sensing module disposed in the chassis, the sensing module sensing whether the air duct is correctly installed;
a board management controller disposed in the chassis and coupled to the sensing module; and
a communication module, the board management controller being coupled to the communication module;
wherein the sensing module comprises a conductor and two electrical pads, the conductor is disposed on the air duct, one of the two electrical pads is grounded, and the other one of the two electrical pads is coupled to the board management controller and a power supply;
wherein, when the air duct is correctly installed, two ends of the conductor respectively contact the two electrical pads, such that the board management controller reads a low signal;
wherein, when the air duct is not correctly installed, at least one of the two ends of the conductor is separated from at least one of the two electrical pads, such that the board management controller reads a high signal to generate a warning message and controls the communication module to send out the warning message to an external device.

2. The server of claim 1, wherein the conductor is a wire, a metal sheet or a conducting paint.

3. An air duct sensing method comprising steps of:
disposing an air duct in a chassis;
a sensing module sensing whether the air duct is correctly installed, wherein the sensing module comprises a conductor and two electrical pads, the conductor is disposed on the air duct, one of the two electrical pads is grounded, the other one of the two electrical pads is coupled to a board management controller and a power supply;
when the air duct is correctly installed, two ends of the conductor respectively contacting the two electrical pads, such that the board management controller reads a low signal; and
when the air duct is not correctly installed, at least one of the two ends of the conductor being separated from at least one of the two electrical pads, such that the board management controller reads a high signal to generate a warning message and controls a communication module to send out the warning message to an external device.

4. The air duct sensing method of claim 3, wherein the conductor is a wire, a metal sheet or a conducting paint.

* * * * *